（12） United States Patent
Williams (10) Patent No.: US 9,723,748 B2
(45) Date of Patent: Aug. 1, 2017

(54) ELECTRONIC MODULE WITH REMOVABLE FAN ASSEMBLY (71) Applicant: Jabil Circuit, Inc., St. Petersburg, FL (US)

(72) Inventor: Carl D. Williams, Manitou Springs, CO (US)

(73) Assignee: Jabil Inc., St. Petersburg, FL (US)

( * ) Notice: Subject to any disclaimer, the term of this patent is extended or adjusted under 35 U.S.C. 154(b) by 12 days.

(21) Appl. No.: 14/832,295

(22) Filed: Aug. 21, 2015

(65) Prior Publication Data
US 2016/0053776 A1 Feb. 25, 2016

Related U.S. Application Data (60) Provisional application No. 62/041,240, filed on Aug. 25, 2014.

(51) Int. Cl.
*H01L 23/467* (2006.01)
*G06F 1/20* (2006.01)
*H05K 7/20* (2006.01)
*F04D 19/00* (2006.01)
*F04D 29/60* (2006.01)
*G11B 33/14* (2006.01)

(52) U.S. Cl.
CPC ....... *H05K 7/20136* (2013.01); *F04D 19/007* (2013.01); *F04D 29/601* (2013.01); *G06F 1/20* (2013.01); *G11B 33/142* (2013.01); *H01L 23/467* (2013.01); *H05K 7/20172* (2013.01)

(58) Field of Classification Search
CPC .............. H01L 23/467; H01L 21/67775; F24F 11/0001; G06F 1/20; G06F 1/206; G06F 1/203; G06F 1/3203; G06F 1/181; G06F 2200/201; G06F 1/188; F04D 29/646; F04D 25/08; F04D 19/002; F04D 29/703; F04D 29/626; F04D 29/664; F04D 29/668
USPC ........................ 361/679.46–679.51, 694–697
See application file for complete search history.

(56) References Cited

U.S. PATENT DOCUMENTS

| | | | | |
|---|---|---|---|---|
| 6,040,981 A * | 3/2000 | Schmitt | ..................... | G06F 1/18 312/221 |
| 7,379,300 B1 * | 5/2008 | Chen | .................. | H05K 7/20172 165/122 |
| 2002/0015648 A1 * | 2/2002 | Kosugi | ................. | F04D 25/166 417/423.14 |
| 2003/0209341 A1 * | 11/2003 | Deboer | ............... | H01L 23/4093 165/80.3 |
| 2003/0221291 A1 * | 12/2003 | Stewart | .............. | H05K 7/20172 16/422 |
| 2004/0115986 A1 * | 6/2004 | Chen | ..................... | F04D 29/601 439/485 |
| 2006/0203447 A1 * | 9/2006 | Kyle | .................. | H05K 7/20172 361/695 |

(Continued)

Primary Examiner — Adam B Dravininkas
(74) Attorney, Agent, or Firm — Volpe and Koenig, P.C.

(57) ABSTRACT

A fan assembly for an electronics module is presented, the fan assembly includes a fan housing at least partially enclosing a fan, a first bracket assembly at a first end of the fan housing, the first bracket having a handle and a latching element, and a second bracket disposed on a second end of the fan housing. The handle is movable between an unlatched position for manual grasping of the handle and a latched position for allowing an air flow through the fan assembly.

16 Claims, 6 Drawing Sheets (56) References Cited

U.S. PATENT DOCUMENTS

| | | | |
|---|---|---|---|
| 2007/0035924 A1* | 2/2007 | Westphall | G06F 1/20 361/679.48 |
| 2008/0137295 A1* | 6/2008 | Chen | G06F 1/183 361/695 |
| 2012/0027580 A1* | 2/2012 | Lu | F04D 25/0613 415/214.1 |
| 2013/0064650 A1* | 3/2013 | Wang | G06F 1/20 415/182.1 |
| 2015/0208548 A1* | 7/2015 | Chu | H05K 7/20172 361/695 |

\* cited by examiner

ELECTRONIC MODULE WITH REMOVABLE FAN ASSEMBLY

CROSS REFERENCE TO RELATED APPLICATION

This application claims the benefit of U.S. Provisional Application No. 62/041,240 having a filing date of Aug. 25, 2014, which is incorporated by reference as if fully set forth.

FIELD OF INVENTION

The present invention relates generally to electronic systems, more particularly to fan assemblies for electronic modules.

BACKGROUND

Electronic systems commonly include fans, for example cooling fans, sized to fit within an electronics module that itself fits inside a larger system. The available space for these fans and modules is often limited. Fans typically include moving parts, and certain moving components are subject to wear and failure, negatively impacting the function of the fan. Because of the nature of cooling to the overall function of the electronic module, and the overall electronic system, prompt replacement of a faulty or failed fan is often important.

One may typically be required to remove an entire electronic module to replace a fan. This may typically require the module to be shut down for the length of time it takes to access the fan, remove, and replace it. The removal of such a module puts the larger system at risk for failure during its absence, and may require a shut-down of the system during the repair, for example. Also, some modules require the use of tools to access a fan, creating a risk for damage during the fan replacement.

A need exists for a fan assembly that is quickly and easily removable, and may be, in certain embodiments, replaceable without interruption of the function of the electronic module in which it resides or to the larger electronic system.

SUMMARY

Embodiments of a fan assembly and an electronics module including the fan assembly are provided herein. In some embodiments, a fan assembly for an electronics module comprises a fan housing at least partially enclosing a fan. A first bracket is disposed on a first end of the fan housing, the first bracket comprising a handle and a latching element. A second bracket is disposed on a second end of the fan housing. The handle is movable between an unlatched position facilitating manual grasping of the handle and a latched position facilitating an air flow through the fan assembly.

In some embodiments, an electronics module comprises a case having a first end with at least one opening and a fan assembly having a fan housing at least partially enclosing a fan. A first bracket is disposed on a first end of the fan housing, the first bracket comprising a handle and a latching element. A second bracket is disposed on a second end of the fan housing. The handle is movable between an unlatched position facilitating manual grasping of the handle and a latched position facilitating an air flow through the fan assembly. The fan assembly is received in the opening, and wherein the handle includes a first end for gripping and a second end that includes the latching element.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting in scope, for the invention may admit to other equally effective embodiments.

DETAILED DESCRIPTION

Certain terminology is used in the following description for convenience only and is not limiting. Relational words, such as "upper", "lower", "front", and "rear", designate directions in the drawings to which reference is made. The terminology includes the words specifically noted above, derivatives thereof and words of similar import.

Figure 1:
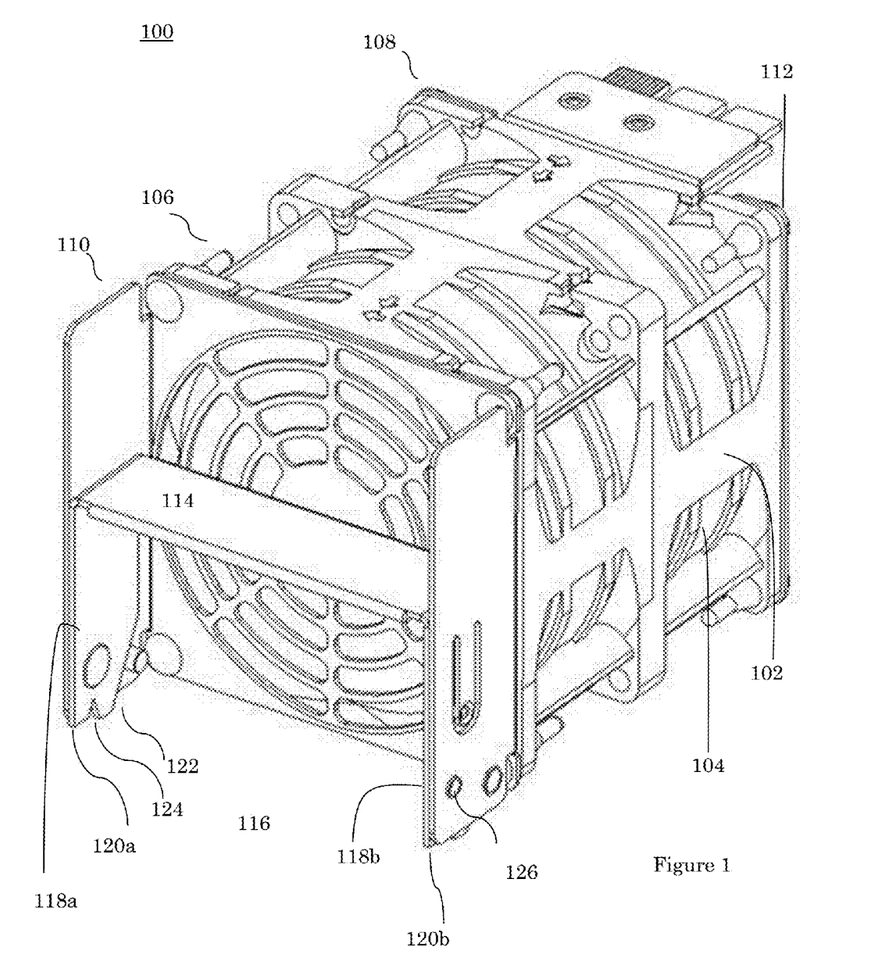
FIG. 1 is a perspective view of a fan assembly in accordance with an embodiment of the present invention.

FIG. 1 depicts a perspective view of a fan assembly 100 in accordance with an embodiment of the present invention. The fan assembly 100 includes a fan housing 102 that at least partially encloses a fan 104 and has a first end 106 and a second end 108. The first and second ends 106, 108 are configured to facilitate mounting of a first and second bracket 110, 112, respectively. The fan 104 may be of any construction to induce a fluid flow, such as an air flow. As illustrated, the fan 104 induces a flow through the fan and the fan housing 102 from one end to another, with the axis of flow generally aligned with the longitudinal axis of the fan and housing.

Figure 2:
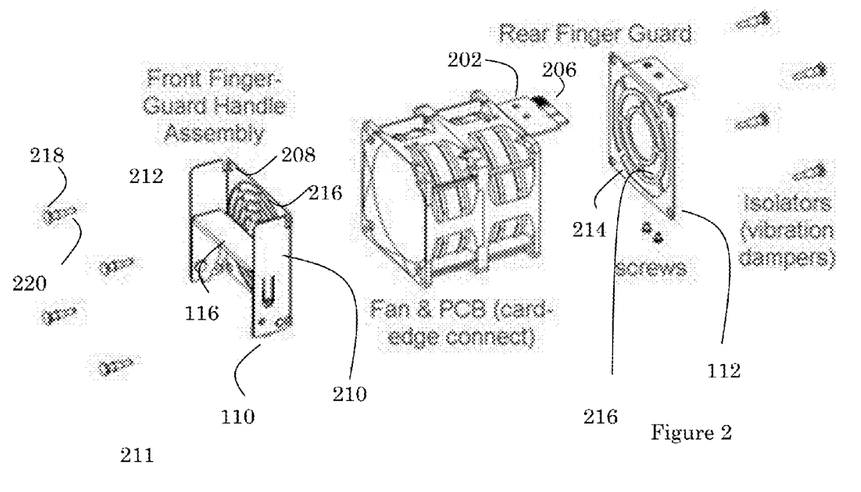
FIG. 2 is an exploded view of the assembly of FIG. 1.

Referring now also to FIG. 2, an electrical connector 202 for providing electrical connection to the fan 104 extends from a portion the fan housing 102 and may be partially supported by a portion of the housing 102. The electrical connector 202 is electrically coupled to the windings of the fan 104 motor, for example by soldering. As illustrated, the electrical connector 202 may be a card edge connector, or other type connector suitable for providing an electrical signal to the fan.

As illustrated, the first bracket 110 is a generally U-shaped structure with a central portion 208 and two tabs 210, 212 extending in the same direction from opposite side edges of the central portion 208. The first bracket 110 is disposed proximate the first end 106 of the fan housing 102 so that the outer periphery of the first bracket 110 is aligned with the outer periphery of the fan housing 102. So configured, the width and height of the first bracket 110 are substantially the same as or, for example about the same size as or smaller in either dimension than, the portion of the fan housing 102 to which they are aligned.

Attached to the first bracket 110 is a handle 114 forming a first bracket assembly 211. As shown, the handle 114 is a generally U-shaped structure with a first end, gripping portion 116, joining the two legs 118a, 118b, and adapted for manual gripping. The second end 122 of the handle 114 includes the free ends 120a, 120b of the two legs 118a, 118b. In the non-limiting embodiment shown, the second end 122 of the handle 114 includes a latching element 124 at the free end 120a, 120b of each leg. The latching element 124 may be integrally formed with the legs 118a, 118b or may be separately formed and joined to the free end of the legs 118a, 118b. In other embodiments, one leg, or neither leg, may include the latching element.

As illustrated, the handle 114 is connected to the first bracket 110 for rotation between a latched position (as shown in FIGS. 1 and 2), and an unlatched position. The handle 114 may be a cam handle configured to require different levels of insertion and extraction forces depending on the position of the handle 114. For example, in an unlatched position, the cam handle 114 may be configured to provide a low level of extraction force (i.e., low resistance to axial displacement) while in the latched position, the cam handle 114 may be configured to provide a high level of extraction force (i.e., high resistance to axial displacement).

In the latched position, a latching element 124 is in a first, latching position and a gripping portion 116 of the handle 114 is positioned so as to allow unobstructed, or substantially unobstructed, air flow through the fan 104 and fan housing 102 while remaining within the periphery of the central portion 208 of the first bracket 110. As shown, the first end of the handle 114 is positioned substantially aligned with the longitudinal axis of the fan housing 102 so that the gripping portion 116 provides minimal or no obstruction to the flow of the fan 104.

A second bracket 112 is disposed proximate the second end 108 of the fan assembly 100 aligned with the outer periphery of the fan housing 102 so that the width and height of the second bracket 112 are no larger in either dimension than the portion of the fan to which they are aligned.

The second bracket 112 includes a generally flat central portion 214 and an electrical connection support 204 extending from a portion of an edge of the central portion 214. The electrical connection support 204 is disposed adjacent to, and in support of, the electrical connector 202 of the fan. In some embodiments, the electrical connector 202 may be fastened to the electrical connector support 204.

As illustrated, the fan housing 102 and the first and second brackets 110, 112 are shown as having a rectangular shape for ease of illustration only. Other shapes can be used for the fan housing and the first and second brackets so that the brackets do not increase the frontal area of the first side or second side of the fan housing during insertion/removal. One or both of the central portions 208, 214 of the first and second brackets 110, 112 may include a plurality of passages 216 through the thickness of the central portions 208, 214 to facilitate fluid flow, e.g., air flow, along the axis of the fan housing 102. The passages 216 may be sized so as to prevent, or substantially prevent, foreign objects from entering the interior of the fan housing 102. At least some of the plurality of passages 216 may be formed as, or covered with, a material to filter the fluid flow passing through the fan housing, such as a screen, a woven porous material, or an open cell foam material, all by way of non-limiting examples.

The brackets 110, 112 may be fastened to the fan housing 102 using suitable fasteners or fastener system 218, including but not limited to threaded fasteners, expanding mechanical fasteners or adhesives. Four fasteners 218 are shown, although fewer or more fasteners could be used. Vibration dampers 220 may be incorporated with the fasteners or fastener systems 218 to mitigate, attenuate or eliminate the transmission of vibration or mechanical noise from the fan 104 and fan housing 102 to the brackets 110, 112.

Figure 3:
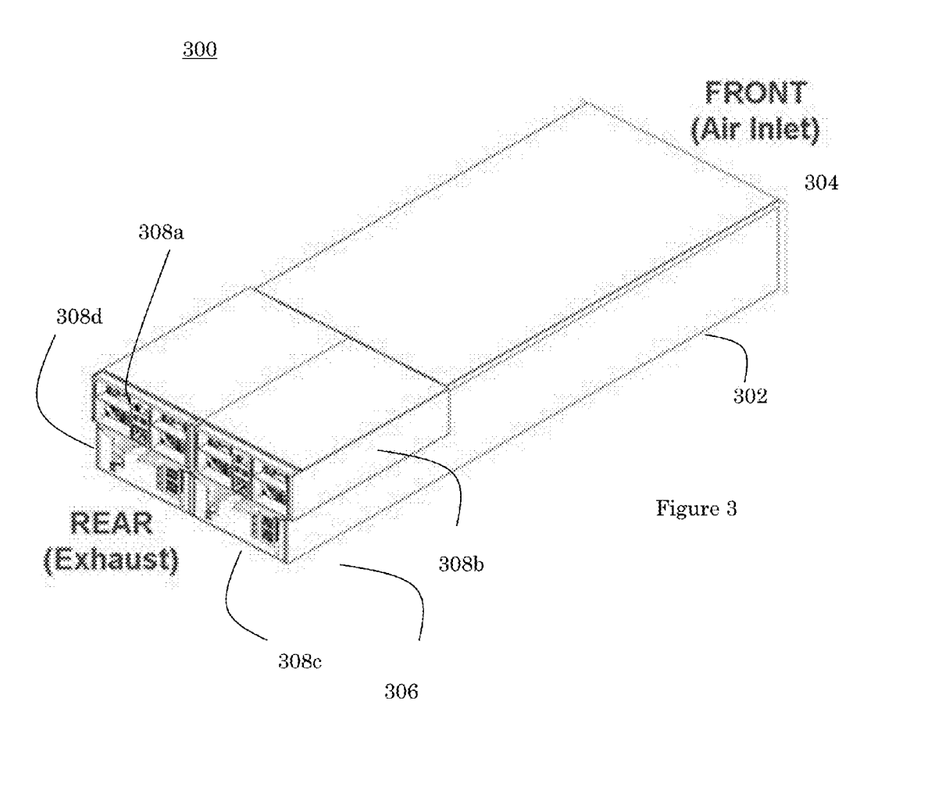
FIG. 3 is a perspective view of an electronics system in which an electronics module according to the present invention may be beneficially used.
Figure 4:
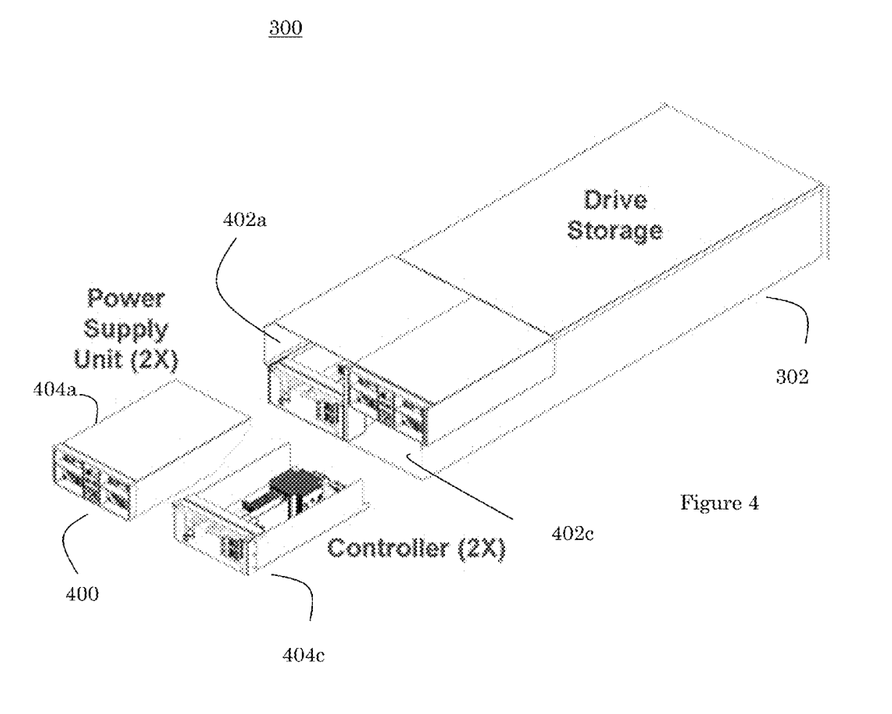
FIG. 4 is a partial exploded view of the electronics system of FIG. 3.

FIGS. 3-4 are illustrative of an electronic system 300 which may benefit from the electronics module 400 of the present invention. The non-limiting electronics system 300 of FIG. 3 includes an electronics system housing 302 with a front side 304 and a rear side 306, with the rear side 306 configured to accept electronics modules 308a-308d (four shown). The electronics system 300 may be, for example, a drive storage system including two controllers 308c, 308d and two power supplies 308a, 308b removably received in one or more openings arranged on the rear side of the electronics system housing 302. As illustrated, the two power supplies are disposed above the two controllers, although this arrangement is for illustrative purposes only as other arrangements may be used. The modules 308a-308d may be slidably received in the housing 302. The upper module, which may be at least 308a, 308b as shown in FIG. 3, may be supported by the lower module, which may be 308c, 308d as shown in FIG. 3, the electronics system housing 302, or a combination of the lower module (e.g. 308c, 308d) and the housing 302. The lower module (e.g. 308c, 308d) may depend from, and received support from, the upper module (e.g., 308a, 308b), may be supported by the electronic system housing 302, or may be supported by a combination of the housing 302 and the upper module (e.g., 308a, 308b).

In certain embodiments of the present invention, power supply modules 308a, 308b and controller modules 308c, 308d are removably coupled to the electronics system housing 302 and may be mechanically or electrically coupled to other components (not shown) of the electronics system 300. As illustrated in FIG. 4, the electronic modules are each at least partially contained within a case 404a, 404c, with the case sized and configured to be received within the openings 402a, 402c of the system housing 302.

The two power supply modules 308a 308b are similarly constructed and each is illustrated as including two fan assemblies 100 in accordance an embodiment of the present invention. One or more of the controllers 308, 308d, and/or other modules, could also include a fan assembly 100.

Figure 5:
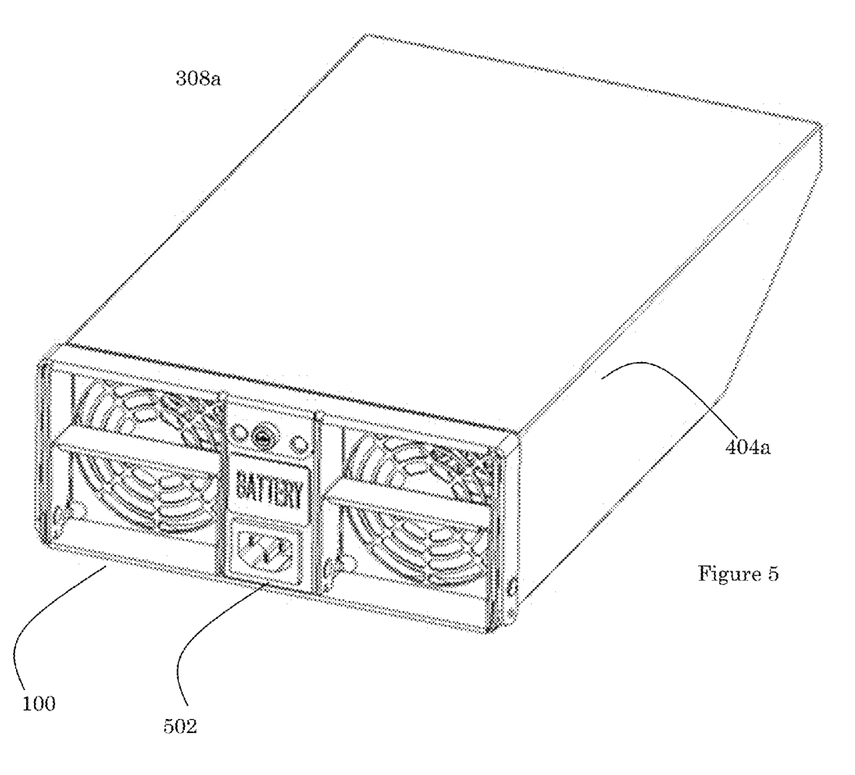
FIG. 5 is a perspective view of an electronics module of the electronics system of FIG. 3.
Figure 6:
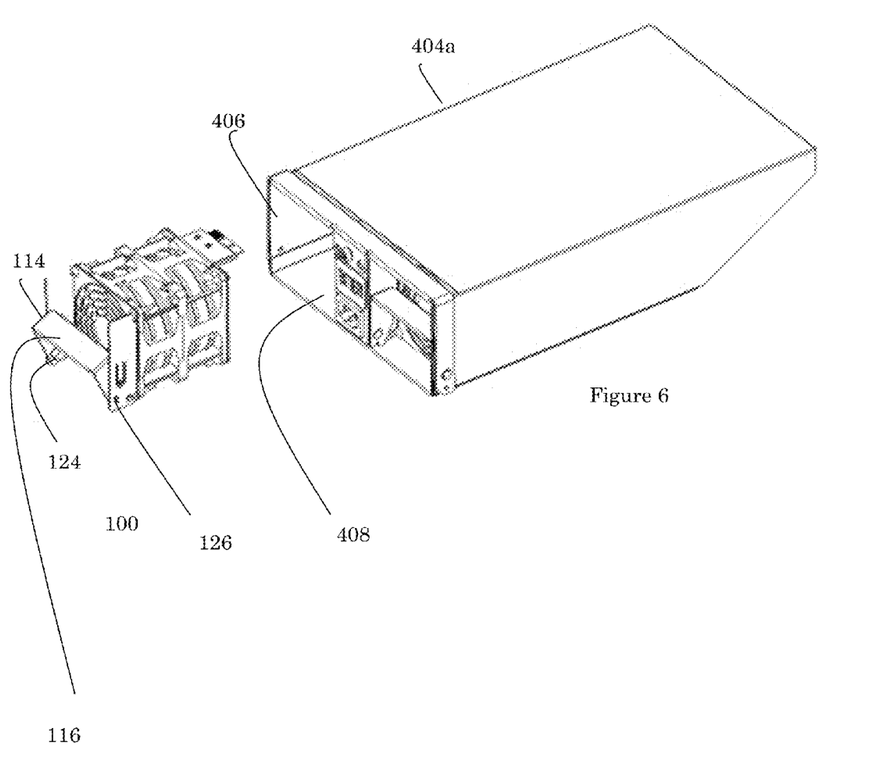
FIG. 6 is a partial exploded view of the electronics module of FIG. 5.

FIGS. 5 and 6 are illustrative of a power supply module 308a suitable for use in the exemplary electronic system of FIGS. 3 and 4. The power supply module 308a includes, for example, a battery 502 and associated electronics (not shown) for managing the power condition of the battery (charging, discharging, or maintaining the charge as appropriate). The power supply module 308a includes, for example, one or more fan assemblies 100 (two shown) in accordance with the present invention slidably received in the end of a case 404a. The end of the case 404a defines an opening 408 configured to accept the fan assembly 100 and provides engagement features to cooperate with a latching element 124 on the second end 122 of the handle 114 to secure the proper placement of the fan assembly 100 in the power supply case 404a.

In certain embodiments of the present invention, electrical connector 200 of the fan assembly 100 is electrically coupled to the fan assembly 100 to provide the fan 104 with power. The electrical coupling may provide controlled power to the fan, for example, the coupling may control the current or voltage provided to the fan, or provide power to the fan only when certain conditions are met (e.g., elapsed time from an event or temperature of a component). In the non-limiting embodiments of FIGS. 1, 2, and 6, the fan assembly 100 is illustrated with one electrical connector 202 for ease of illustration only. More than one connector may be used, with one connector for power and the other for control, for example.

FIG. 6 illustrates the fan assembly 100 separated from the module case 404*a* in a position corresponding to either prior to installation or following removal from the module case 404*a*. As illustrated, the handle 114 is in a second position corresponding to an installation or removal position in which the latching element 124 is in an un-latched position. In the unlatched position, the gripping portion 116 of the handle 114 is in a position facilitating gripping, for example gripping by hand, to impart displacement of the fan assembly 100 along the longitudinal axis of the fan assembly. This is a position different than the first (latched) position as shown in, for example, FIGS. 1 and 2 in which the latching element 124 is positioned to engage a feature on the case 404*a* or on the electronics system housing 302 to prevent displacement of the fan assembly 100 with respect to the case or the electronics system housing.

As illustrated in FIG. 6, the handle 114 is rotated about a pivot point 126 so that the gripping portion 116 is rotated away from the first bracket assembly 211 to facilitate application of a force to cause displacement along the longitudinal axis. In this unlatched position, the latching elements 124 are positioned to freely pass into or out of the electronics system housing 302.

When the fan assembly 100 is properly placed in the electronics assembly housing 302 and the handle 114 placed in the latched position of FIGS. 1 and 2 for example, the latching elements 124 are positioned so that they engage a portion of the case 404*a* to resist axial displacement of the fan assembly 100 with respect to the case. With the handle 114 in the latched position, the fan assembly may be retained in the case 404*a* to resistance displacement during shock and vibration.

In some embodiments, the module, for example 404*a* can include a handle (not shown) as described above for removing/installing the modules, for example the power supply module 404*a* or the controller module 404*c*. The handle 114 can be movable between a latched position in which latching elements 124 can engage a portion of the electronics system housing 302 to retain the modules in the housing and a unlatched position in which the latching elements 124 do not engage the electronics system housing and the module can be moved with respect to the electronics system housing.

As illustrated in FIG. 4, the module including the inventive fan assembly 100, here in the power supply module 404*a*, can be removed from the electronics system 300 without disturbing any other modules in the electronics system 300. Removal of the power supply module 404*a* may be accomplished without removing power from the electronics system 300, for example by maintaining power as supplied by the second power supply module 404*b*. As illustrated in FIGS. 5 and 6, the fan assembly 100 can be removed from the module case 404*a* without disturbing any other modules in the case. The removal can be accomplished without removing power from the other modules 404*b* or the power supply module 308*a*.

Thus embodiments of a fan assembly that is quickly and easily removable without interruption of the function of the electronic module in which it resides or to the larger electronic system are provided herein. The inventive fan assembly reduces the complexity and time required to exchange a fan assembly or fan module. Accordingly, the disclosed fan assembly may be advantageously impacted maintenance of electronic systems by eliminating, or substantially reducing, the time and complexity of replacing modules thereby improving productivity and system uptime.

What is claimed is:

1. A fan assembly for an electronics module, the fan assembly comprising:
   a fan housing at least partially enclosing a fan;
   a first bracket assembly disposed on a first end of the fan housing, the first bracket comprising a handle,
   wherein the handle is movable between an unlatched position facilitating manual grasping of the handle and a latched position facilitating an air flow through the fan assembly;
   a second bracket disposed on a second end of the fan housing,
   wherein the second bracket comprises an electrical connector support for supporting an electrical connector of the fan that provides controlled power to the fan for predetermined temperature conditions, and
   vibration dampers for connecting the first bracket and the second bracket to the fan housing.

2. The fan assembly of claim 1, wherein the electrical connector is a card edge connector.

3. The fan assembly of claim 2, wherein at least one of the first bracket and the second bracket includes a finger guard.

4. The fan assembly of claim 3, wherein the handle has a first end adapted for gripping.

5. The fan assembly of claim 4, wherein the handle has a second end that includes a latching element.

6. An electronics module comprising:
   a case having a first end with at least one opening; and
   a fan assembly comprising:
      a fan housing at least partially enclosing a fan;
      a first bracket assembly disposed on a first end of the fan housing, the first bracket comprising a handle,
      wherein the handle is movable between an unlatched position facilitating manual grasping of the handle and a latched position facilitating an air flow through the fan assembly, and
      wherein the fan assembly is received in the opening,
      a second bracket disposed on a second end of the fan housing,
      wherein the second bracket comprises an electrical connector support for supporting an electrical connector of the fan that provides controlled power to the fan for predetermined temperature conditions, and
      vibration dampers for connecting the first bracket and the second bracket to the fan housing.

7. The electronics module of claim 6, wherein the handle has a first end for gripping the handle and a second end that includes a latching element.

8. The electronics module of claim 7, wherein in the latched position, the latching element engages a portion of the electronics module so that displacement of the fan assembly with respect to the electronics module is prevented and in the unlatched position, displacement is permitted.

9. The electronics module of claim 7, wherein the electrical connector is a card edge connector.

10. The electronics module of claim 9, wherein at least one of the first bracket and the second bracket includes a finger guard.

11. The electronics module of claim 10, wherein the handle has a first end adapted for gripping.

12. A fan assembly for an electronics module, the fan assembly comprising:
- a fan housing at least partially enclosing a fan;
- a first bracket assembly disposed on a first end of the fan housing, the first bracket comprising a handle;
- a second bracket disposed on a second end of the fan housing, the second bracket comprising an electrical connector for the fan and;
- vibration dampers for connecting the first bracket and the second bracket to the fan housing,
- wherein the electrical connector of the fan provides controlled power to the fan for predetermined temperature conditions, and
- wherein the handle is movable between an unlatched position facilitating manual grasping of the handle and a latched position facilitating an air flow through the fan assembly.

13. The fan assembly of claim 12, wherein the second bracket comprises an electrical connector support for supporting the electrical connector of the fan.

14. The fan assembly of claim 13, wherein the electrical connector is a card edge connector.

15. The fan assembly of claim 12, wherein the handle has a first end adapted for gripping.

16. The fan assembly of claim 15, wherein the handle has a second end that includes a latching element.

* * * * *